US 8,399,352 B2

(12) United States Patent
Werner et al.

(10) Patent No.: US 8,399,352 B2
(45) Date of Patent: Mar. 19, 2013

(54) SEMICONDUCTOR DEVICE COMPRISING SELF-ALIGNED CONTACT BARS AND METAL LINES WITH INCREASED VIA LANDING REGIONS

(75) Inventors: Thomas Werner, Moritzburg (DE); Peter Baars, Dresden (DE); Frank Feustel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/331,606

(22) Filed: Dec. 20, 2011

(65) Prior Publication Data
US 2012/0153366 A1 Jun. 21, 2012

(30) Foreign Application Priority Data
Dec. 21, 2010 (DE) .................. 10 2010 063 775

(51) Int. Cl.
*H01L 21/4763* (2006.01)
(52) U.S. Cl. ........ 438/637; 438/379; 438/586; 438/668; 438/700; 257/E21.409; 257/E29.255
(58) Field of Classification Search .................. 438/379, 438/586, 637, 668, 700; 257/288, 312, E21.62, 257/E21.409, E21.627, E29.255
See application file for complete search history.

(56) References Cited

U.S. PATENT DOCUMENTS

| 6,911,397 B2 | 6/2005 | Jun et al. .................... 438/700 |
| 2001/0008226 A1 | 7/2001 | Hung et al. ................... 216/18 |
| 2005/0230716 A1* | 10/2005 | Moriya et al. ............... 257/288 |
| 2006/0246718 A1 | 11/2006 | Frohberg et al. ............. 438/638 |
| 2009/0140431 A1 | 6/2009 | Feustel et al. ............... 257/758 |
| 2009/0194825 A1 | 8/2009 | Werner et al. ............... 257/397 |
| 2010/0244113 A1* | 9/2010 | Rieh et al. .................... 257/312 |
| 2010/0301486 A1* | 12/2010 | Frohberg et al. ............. 257/770 |

FOREIGN PATENT DOCUMENTS

| DE | 103 18 299 A1 | 4/2003 |
| DE | 102005020132 A1 | 11/2006 |
| DE | 102007057682 A1 | 6/2009 |
| DE | 102008006960 A1 | 8/2009 |

OTHER PUBLICATIONS

Translation of Official Communication from German Patent Office for German Patent Application No. 10 2010 063 775.0 dated Jun. 21, 2011.

* cited by examiner

*Primary Examiner* — Charles Garber
*Assistant Examiner* — Abdulfattah Mustapha
(74) *Attorney, Agent, or Firm* — Williams, Morgan & Amerson, P.C.

(57) ABSTRACT

When forming metal lines of the metal zero level, a reduced bottom width and an increased top width may be achieved by using appropriate patterning regimes, for instance using a spacer structure after forming an upper trench portion with a top width, or forming the lower portion of the trenches and subsequently applying a further mask and etch regime in which the top width is implemented. In this manner, metal lines connecting to self-aligned contact bars may be provided so as to exhibit a bottom width of 20 nm and less, while the top width may allow reliable contact to any vias of the metallization system.

13 Claims, 8 Drawing Sheets

SEMICONDUCTOR DEVICE COMPRISING SELF-ALIGNED CONTACT BARS AND METAL LINES WITH INCREASED VIA LANDING REGIONS

BACKGROUND OF THE INVENTION

1. Field of the Invention

The present disclosure generally relates to the fabrication of integrated circuits, and, more particularly, to the contact level of a semiconductor device, in which contact areas, such as drain and source regions, are connected to the metallization system of the semiconductor device.

2. Description of the Related Art

In modern integrated circuits, such as microprocessors, storage devices and the like, a very high number of circuit elements, especially transistors, are provided and operated on a restricted chip area. Although immense progress has been made over recent decades with respect to increased performance and reduced feature sizes of the circuit elements, the ongoing demand for enhanced functionality of electronic devices forces semiconductor manufacturers to steadily reduce the dimensions of the circuit elements and to increase the operating speed thereof. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain and a source.

On the basis of the field effect transistors, more complex circuit components may be composed, such as inverters and the like, thereby forming complex logic circuitry, memory devices and the like. Due to the reduced dimensions, the operating speed of the circuit components has been increased with every new device generation, wherein, however, the limiting factor of the finally achieved operating speed of complex integrated circuits is no longer the individual transistor elements but the electrical performance of the complex wiring fabric, which may be formed above the device level including the actual semiconductor-based circuit elements, such as transistors and the like. Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the inner-level electrical connection, and also include a plurality of inter-level connections, which are also referred to as vias. These interconnect structures comprise an appropriate metal and provide the electrical connection of the individual circuit elements and of the various stacked metallization layers.

Furthermore, in order to establish a connection of the circuit elements with the metallization layers, an appropriate vertical contact structure is provided, which connects to a respective contact region of a circuit element, such as a gate electrode and/or the drain and source regions of transistors, and to a respective metal line in the metallization layer. The contact structure may comprise contact elements or contact plugs having a generally square-like or round shape that are formed in an interlayer dielectric material, which in turn encloses and passivates the circuit elements. Upon further shrinkage of the critical dimensions of the circuit elements in the device level, the dimensions of metal lines, vias and contact elements also have to be adapted to the reduced dimensions, thereby requiring sophisticated metal-containing materials and dielectric materials in order to reduce the parasitic capacitance in the metallization layers and provide a sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electromigration behavior as is required in view of reliability of the integrated circuits. Consequently, in lower-lying metallization levels, metal lines and vias having critical dimensions of approximately 100 nm and significantly less may have to be provided in order to achieve the required "packing density" in accordance with density of circuit elements in the device level.

Upon further reducing the dimensions of the circuit elements, for instance using critical dimensions of 50 nm and less, the contact elements in the contact level have to be provided with appropriate critical dimensions on the same order of magnitude. The contact elements typically represent plugs, which are formed of an appropriate metal or metal composition, wherein, in sophisticated semiconductor devices, tungsten, in combination with appropriate barrier materials, has proven to be a viable contact metal. When forming tungsten-based contact elements, typically, the interlayer dielectric material is formed first and is patterned so as to receive contact openings, which extend through the interlayer dielectric material to the corresponding contact areas of the circuit elements. In particular, in densely packed device regions, the lateral size of the drain and source areas and, thus, the available area for the contact regions is 100 nm and significantly less, thereby requiring extremely complex lithography and etch techniques in order to form the contact openings with well-defined lateral dimensions and with a high degree of alignment accuracy. For this reason, frequently, contact trenches or contact bars are formed in the interlayer dielectric material in order to connect to the corresponding drain and source areas along a significant portion or the entire width of transistor devices. In some sophisticated techniques, the contact bars are formed in a first portion of the interlayer dielectric material and connect to the drain and source contact areas, while, on the other hand, a height of the contact bars is restricted to approximately the height of the gate electrode structures in order to not unduly increase the overall fringing capacitance. That is, any gate electrode structures may, for instance, be connected by appropriate contact elements or vias, which in turn may connect to a metallization system to be formed above the circuit elements. On the other hand, the contact bars may connect to appropriately positioned and dimensioned metal lines, frequently formed of a highly conductive material, such as copper and the like, which in turn may be contacted by appropriate vias that establish the vertical connection to the actual metallization system of the semiconductor device. The metal lines for connecting to the contact bars, which are frequently referred to as metal lines of a metal zero level, have to be provided with an appropriately adapted bottom width, in particular in densely packed device areas, since here the self-aligned contact bars may have a top width of approximately 50 nm and significantly less, wherein, in sophisticated applications, even a top width of the contact bars may be 20 nm and less. On the other hand, a top width of these metal zero metal lines may have to provide sufficient margins in order to enable a reliable "landing" of vias as vertical contacts for connecting to the metallization system. Consequently, in conventional strategies, the corresponding openings in the dielectric material of the metal zero level may be formed with appropriate etch strategies, in which extremely steep sidewall angles are achieved, which, however, may also result in a reduced top critical dimension, while at the same time the overall control of the critical dimensions is significantly reduced. On the other hand, applying any etch strategies in which a pronounced tapering is achieved so as to provide a sufficient top critical dimension while also complying with an extremely small bottom critical dimension may result in pronounced patterning-related non-uniformities, thereby contributing to a pronounced yield loss in this manufacturing stage.

In view of the situation described above, the present disclosure relates to semiconductor devices and manufacturing techniques in which a contact regime for connecting to contact bars, in particular in densely packed device areas, may be provided, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques and semiconductor devices in which metal lines may be formed above self-aligned contact bars, wherein the metal lines may have a reduced bottom critical dimension, for example, in sophisticated applications 20 nm and less, while, on the other hand, at least locally, appropriate increased lateral dimensions may be provided so as to enable a reliable contacting of metal lines by any metal vias that may provide a vertical contact structure to a metallization system of the semiconductor device. In some illustrative embodiments disclosed herein, a reduced bottom CD (critical dimension) and an increased top CD of corresponding metal lines may be accomplished by forming a first part of a corresponding trench on the basis of the desired top CD, and forming sacrificial spacer elements in the first part of the trench, which may adjust in a self-aligned manner the desired bottom CD of the metal line.

In other illustrative embodiments disclosed herein, appropriate landing areas of the metal lines may be provided in a locally restricted manner by first forming at least a part of trenches in dielectric material on the basis of an etch mask that complies with the desired bottom CD of the metal lines. Thereafter, a further etch mask may be used or the etch mask may be modified so as to comply with the top CD, at least locally, in order to form an upper portion of the trenches with the desired top CD.

One illustrative method disclosed herein relates to forming a semiconductor device. The method comprises providing a contact bar in a first dielectric material that is formed laterally between a first gate electrode structure and a second gate electrode structure, wherein the contact bar has a width and a length. The method further comprises forming a second dielectric material above the first dielectric material and the contact bar. Additionally, the method comprises performing a first etch process on the basis of a first target-critical dimension of a trench in the second dielectric material. Moreover, at least one process is performed so as to adjust a second target-critical dimension of at least a portion of the trench, wherein the second target-critical dimension is greater than the first target-critical dimension. The method further comprises performing a second etch process on the basis of the second target-critical dimension so as to form the trench in the second dielectric material. Additionally, a metal material is formed in the trench.

One illustrative semiconductor device disclosed herein comprises a transistor comprising drain and source regions and a gate electrode structure. Moreover, the semiconductor device comprises a contact bar formed in a first dielectric material and connecting to one of the drain region and the source region, wherein the contact bar extends along a width direction of the transistor and comprises a first conductive material. Furthermore, the semiconductor device comprises a conductive line formed in a second dielectric material, wherein the conductive line comprises an upper portion having a top width and a lower portion having a bottom width. The conductive line further connects to the contact bar and comprises a second conductive material that differs from the first conductive material. Moreover, the bottom width is less than the top width.

A further illustrative semiconductor device disclosed herein comprises a transistor comprising drain and source regions and a gate electrode structure. Furthermore, a contact bar is formed in a first dielectric material and connects to the drain region or the source region, wherein the contact bar extends along a width direction of the transistor and comprises a first conductive material. Moreover, the semiconductor device comprises a conductive line formed in a second dielectric material and connecting to the contact bar, wherein the second conductive material differs from the first conductive material and wherein the conductive line has a landing area of increased width that is locally restricted along the transistor width. Moreover, the semiconductor device comprises a via formed in a metallization layer and connecting to the locally restricted landing area.

BRIEF DESCRIPTION OF THE DRAWINGS

The disclosure may be understood by reference to the following description taken in conjunction with the accompanying drawings, in which like reference numerals identify like elements, and in which.

Figure 1A:
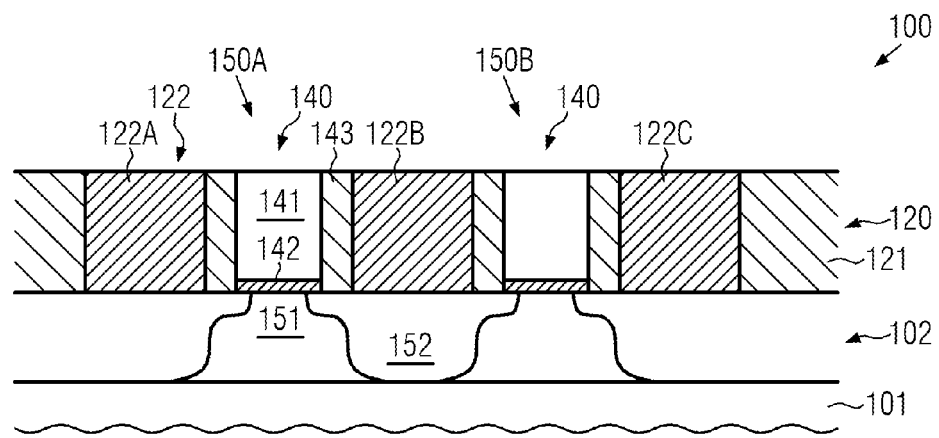
FIGS. 1a-1f schematically illustrate cross-sectional views of a semiconductor device during various manufacturing stages in forming a metal line so as to connect to self-aligned contact bars on the basis of a process strategy in which an upper trench portion of increased lateral width may be formed first, followed by a lower trench portion which may be formed on the basis of reduced lateral dimensions adjusted by means of a spacer structure, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides manufacturing techniques and semiconductor devices in which a metal line may be formed so as to reliably connect to contact bars, which in turn may connect to contact areas of transistors, such as drain or source regions. As discussed above, in particular in densely packed device regions, the metal lines for connecting to the contact bars may have to be provided with a bottom width that is approximately 20 nm or even less, while, on the other hand, a top width may have to ensure a reliable contact to a vertical contact structure, such as a via, of the metallization system. To this end, basically these two etch processes may be applied that may be separately performed on the basis of different target CDs in order to provide superior CD control, while at the same time obtain a significant difference between bottom width and top width of the resulting trench and thus metal line. To this end, in some illustrative embodiments, an upper trench portion may be formed first by using an appropriate etch mask, wherein the etch process may be restricted to an upper part of the dielectric material, for instance by a time-controlled etch process, an intermediate etch stop layer and the like. Thereafter, a process may be applied in which a desired second critical dimension may be adjusted, for instance by forming a spacer element in the previously formed upper portion of the trench, thereby enabling a precise adjustment of the bottom width in a self-aligned manner. On the basis of the internal spacer elements, a further etch process may be performed so as to etch through the entire dielectric material and finally expose the underlying contact bar. After the removal of the spacer element, the upper trench portion and the lower trench portion may be filled with any appropriate conductive material in a common process sequence.

In other illustrative embodiments, a first etch process may be performed on the basis of the bottom CD of the metal line under consideration, followed by a further process or process sequence in order to provide an increased trench width, at least locally, along the length of the trench, which may be accomplished by providing an appropriate etch mask. Thereafter, a further etch process may be performed on the basis of the appropriately adjusted etch mask. In some illustrative embodiments, the initial etch process performed on the basis of the bottom critical dimension may be performed so as to completely etch through the dielectric material, while, in other illustrative embodiments, only an upper part of the dielectric material may be etched. In this case, the actual lower portion of the trench may then be formed concurrently with the upper portion of the trench having, at least locally, the desired top width.

Consequently, superior process uniformity may be achieved, such as superior alignment accuracy and the like, while, at the same time, appropriate landing areas for vias of the metallization system are provided at the top of the metal line, at least locally, while, on the other hand, a required reduced bottom width of the metal lines may be obtained.

FIG. 1a schematically illustrates a cross-sectional view of a semiconductor device 100 in a manufacturing stage in which semiconductor-based circuit elements, such as transistors 150A, 150B, may be provided in and above a semiconductor layer 102. Moreover, the semiconductor device 100 may comprise a substrate 101, which in combination with the semiconductor layer 102 may represent a bulk configuration, i.e., the semiconductor layer 102 may directly connect to a crystalline substrate material, while, in other cases, a silicon-on-insulator (SOI) architecture may be provided in which a buried insulating material (not shown) may be formed directly below the semiconductor layer 102. Furthermore, it should be appreciated that the layer 102 may be referred to as a semiconductor layer, although isolation regions, for instance in the form of trench isolations and the like, may be provided so as to laterally delineate a plurality of active regions, which are to be understood as any semiconductor regions in and above which one or more transistors are to be formed. For convenience, reference sign 102 in FIG. 1a is to represent a portion of semiconductor material in and above which the transistors 150A, 150B are formed. For convenience, any such isolation regions are not illustrated.

In the manufacturing stage shown, the transistors 150A, 150B may comprise a gate electrode structure 140, which may have basically the same configuration and may comprise a gate dielectric material 142 in combination with an electrode material 141. It should be appreciated that the materials 142 and 141 may have any appropriate configuration, in terms of material composition, electronic characteristics and the like, as required for the transistors 150A, 150B. In sophisticated applications, a length of the gate electrode structures 140, i.e., in FIG. 1a the horizontal extension of the electrode material 141 at a height level corresponding to the gate dielectric material 142, may be 50 nm and significantly less, such as 30 nm and less. Furthermore, gate electrode structures 140 may comprise an appropriate sidewall spacer structure 143, which may have any appropriate configuration. The gate electrode structures 140 are formed above respective channel regions 151, which in turn are laterally enclosed by drain and source regions 152. Moreover, as discussed above, the transistors 150A, 150B may represent closely spaced transistor elements so that a lateral space between the gate electrode structures 140 may be 100 nm and less. Consequently, the lateral distance that is available for contact bars 122 of a contact level 120 may depend on the pitch of the gate electrode materials 141 and the lateral dimensions of the spacer structures 143. Thus, in densely packed sophisticated semiconductor devices, a width of corresponding contact bars may be 20 nm and even less. The contact bars 122, wherein, for convenience, contact bars 122A, 122B and 122C are illustrated, are thus embedded in a dielectric material 121, such as the dielectric material of the spacer structures 143 and the like, and may be comprised of any appropriate conductive material which is compatible with the overall device requirements. That is, frequently, a material may be used that provides a high electrical conductivity while at the same time ensuring integrity of the transistors 150A, 150B. In this respect, tungsten has proven to be a viable candidate due to its moderately high conductivity and integrity. It should be appreciated, however, that any other appropriate conductive materials may be used as long as undue diffusion into sensitive device areas may be restricted. It should further be noted that the contact bars 122 may comprise one or more conductive barrier materials, such as titanium, titanium nitride, tantalum, tantalum nitride and the like, as required.

The semiconductor device 100 as illustrated in FIG. 1a may be formed on the basis of any appropriate process strategy. That is, any active regions may be formed in the semiconductor layer 102 based on sophisticated process techniques for forming isolation structures (not shown), followed by the deposition or formation of material layers required for forming the gate electrode structures 140. To this end, any appropriate gate dielectric materials, such as conventional silicon oxide-based materials, high-k dielectric materials, metal-containing electrode materials, semiconductor-based materials and the like, may be formed and may be subsequently patterned so as to obtain the materials 142 and 141 with the desired lateral dimensions. As discussed above, a length of the gate electrode structures 140, which also defines a length direction of the transistors 150A, 150B, may be adjusted to 50 nm and significantly less. On the other hand, the gate electrode structure 140 may have a desired extension along a transistor width direction, i.e., a direction perpendicular to the drawing plane in FIG. 1a. If required, any additional performance enhancing mechanisms may be implemented into the transistors 150A, 150B. Furthermore, the drain and source regions 152 may be formed, for instance, by implantation, epitaxial growth techniques and the like, while also the spacer structures 143 may be provided with the desired configuration. Moreover, after any high temperature processes, additional contact areas, for instance in the form of a metal silicide and the like, may be formed in the drain and source regions 152 and possibly in the gate electrode structures 140, depending on the desired gate architecture. Next, a portion of the drain and source regions 152 may be exposed by performing appropriate etch processes, wherein, for instance, the spacer structure 143 may act as etch stop materials, thereby obtaining a substantially self-aligned patterning behavior. Moreover, an appropriate conductive material may then be deposited in order to form the contact bars 122, which may thus be provided in a self-aligned manner in the form of elongated bars extending along the width direction of the transistors 150A, 150B. Thereafter, any excess material may be removed, for instance by chemical mechanical polishing (CMP) and the like, followed by the deposition of an etch stop material.

Figure 1B:
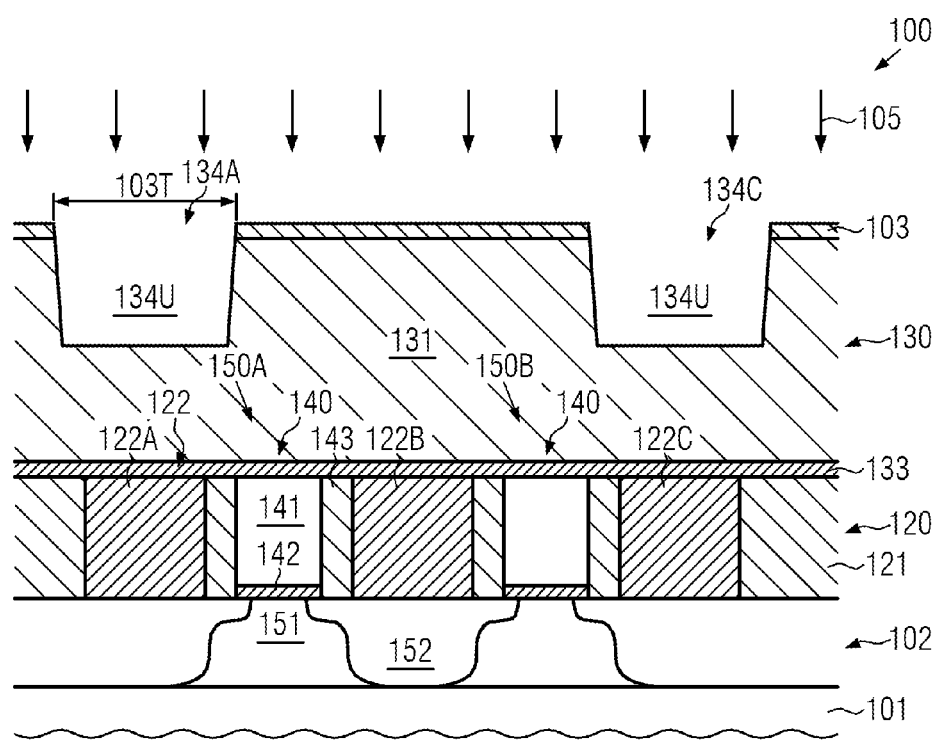

FIG. 1b schematically illustrates the semiconductor device 100 in a further advanced manufacturing stage. As illustrated, a further device level 130, which may also be referred to as a metal zero level, may be provided on the basis of any appropriate dielectric material 131 in combination with an etch stop material 133. For example, if considered appropriate, at least a portion of the dielectric material 131 may be provided in the form of a low-k dielectric material, i.e., as a dielectric material having a dielectric constant of 3.0 or less. On the other hand, the layer 133 may provide a desired etch stop behavior, which may be accomplished by using materials such as silicon nitride, silicon oxynitride, nitrogen-containing silicon carbide and the like. Moreover, as illustrated, a hard mask 103 is formed on or above the dielectric material 131 and is appropriately patterned so as to define a first target dimension 103T, which may substantially correspond to a desired top width of trenches 134A, 134C to be formed in the dielectric material 131 and so as to connect to corresponding contact bars 122A, 122C. In the manufacturing stage shown, the trenches 134A, 134C may comprise an upper trench portion 134U, which may extend into the dielectric material 131 with a desired depth.

The semiconductor device 100 as shown in FIG. 1b may be formed on the basis of the following processes. The etch stop material 133 may be formed on the basis of well-established deposition techniques, such as plasma enhanced chemical vapor deposition (CVD) and the like, followed by the deposition of the material 131, which may be accomplished by spin-on techniques, CVD and the like, depending on the type of material to be used in the metal level 130. Thereafter, typically, a complex patterning process may be applied, for instance based on the hard mask layer 103 in combination with any anti-reflective coating (ARC) materials and resist material, which may be used so as to pattern the hard mask 103 in order to define the lateral size and position of the trenches 134A, 134C, based on the target width 103T. To this end, any appropriate lithography and etch techniques may be applied. It is well known that a plurality of metal-based nitride materials may have a high etch resistance and may be used as an efficient hard mask material for patterning dielectric materials, wherein these materials may be readily removed in a later manufacturing stage. Consequently, the upper portions 134U may be formed on the basis of an anisotropic etch process 105, which may be performed on the basis of well-established etch chemistries. During the etch process 105, the depth of the upper portions 134U may be controlled by controlling the etch time, while, in other cases, an appropriate etch control material may be incorporated into the layer 131, for instance in the form of an etch stop material (not shown), an etch indicator material, which may liberate respective atomic or molecular species, which may be readily detected on the basis of any endpoint detection techniques.

Figure 1C:
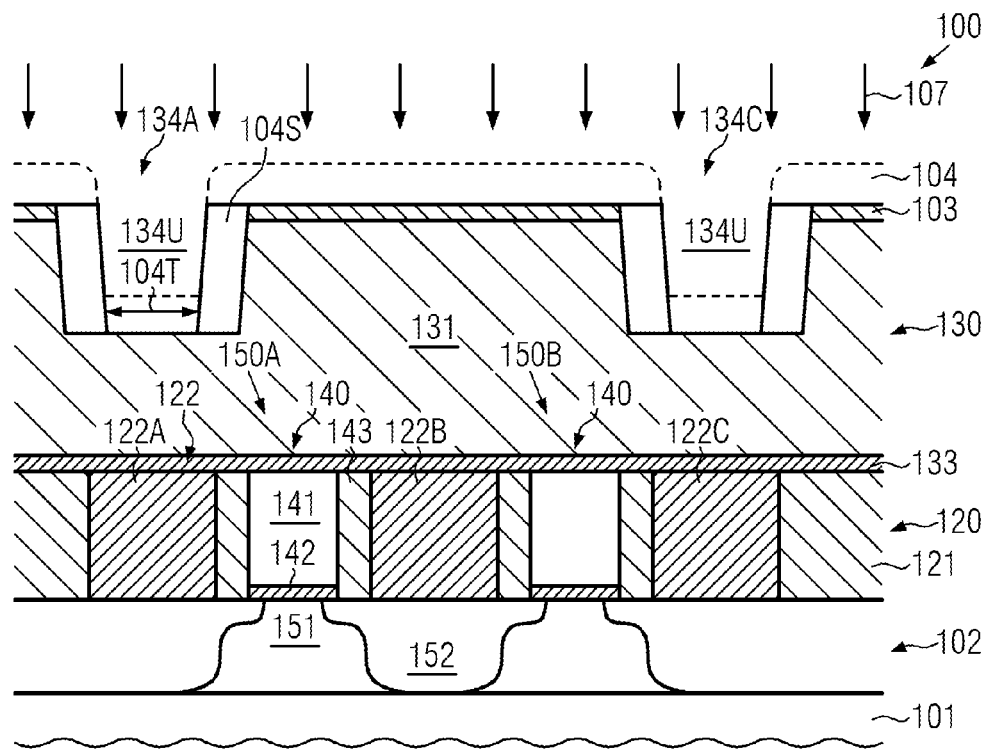

FIG. 1c schematically illustrates the semiconductor device 100 in a further advanced manufacturing stage. As illustrated, a further process or process sequence 107 may be applied in order to adjust or provide a second critical dimension 104T, which may correspond to a desired bottom width of the trenches 134A, 134C. To this end, in the embodiment shown, a spacer element 104S may be formed on inner sidewalls of the upper trench portions 134U, thereby defining the target width 104T. For this purpose, a spacer layer 104, for instance comprised of any appropriate material, such as silicon and the like, may be deposited on the basis of well-established deposition techniques, such as low pressure CVD and the like, in order to form the layer 104 with a desired initial thickness in a conformal manner. Thereafter, the process sequence 107 may comprise an anisotropic etch process for removing portions of the layer 104 at the bottom of the upper portion 134U and from horizontal device areas, thereby exposing the etch mask 103.

Figure 1D:
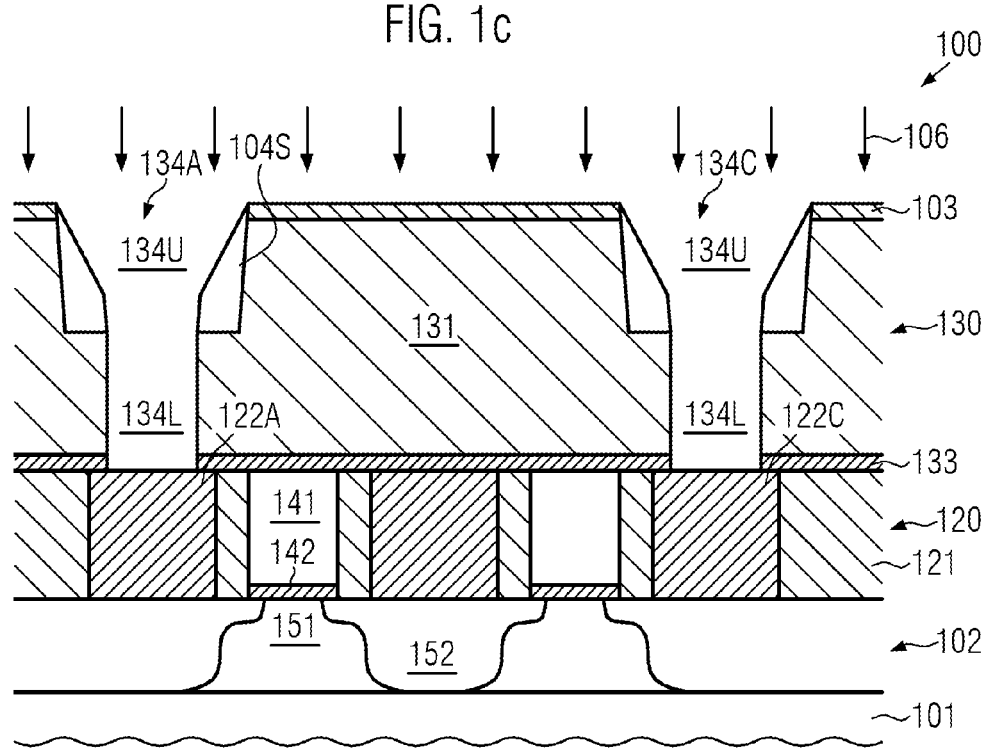

FIG. 1d schematically illustrates the semiconductor device 100 in a further advanced manufacturing stage. As shown, a further anisotropic etch process 106 may be applied, which may now be performed on the basis of the target dimension 104T (FIG. 1c) as defined by the spacer elements 104A. To this end, the etch process 106 may be performed on the basis of an etch chemistry that is selected with respect to the etch mask 103 and with respect to the spacer 104S. In other cases, the selectivity with respect to the spacer elements 104S may not need to be very pronounced as long as these spacers 104S may enable the formation of the lower portion 134L of the trenches 134A, 134C during the process 106. That is, the spacers 104S may be completely consumed during the etch process 106, as long as the etch front may still advance to the depth of the material 131 on the basis of the previously defined target width 104T (FIG. 1c). During the etch process 106, an additional etch step may be applied in order to etch through the etch stop material 133, which may be accomplished on the basis of any well-established etch recipes. For example, silicon nitride materials may be efficiently etched on the basis of plasma assisted recipes, wet chemical etch recipes and the like.

Figure 1E:
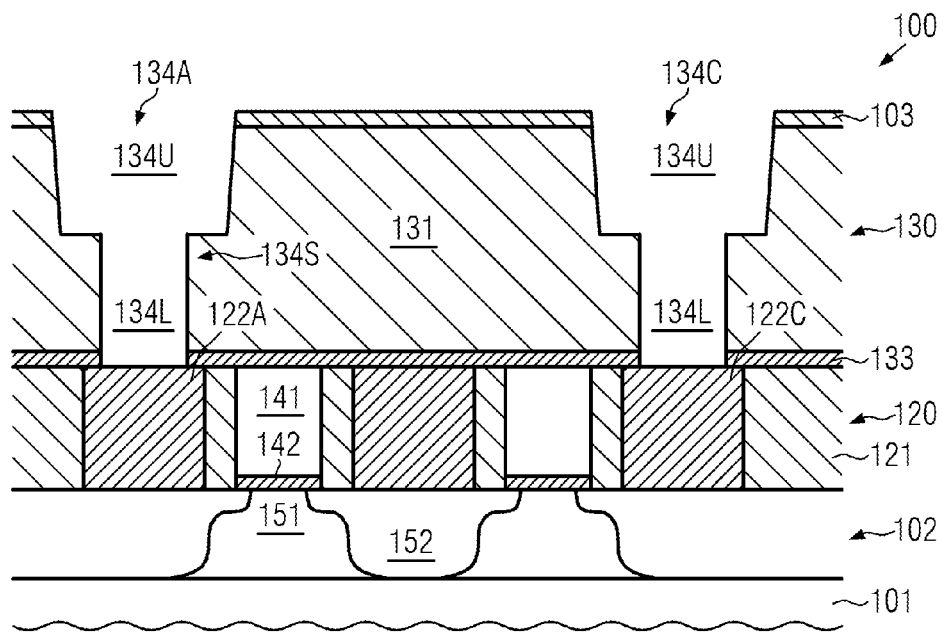

FIG. 1e schematically illustrates the semiconductor device 100 according to illustrative embodiments in which any residues of the spacers 104S (FIG. 1d) may be removed, depending on the selectivity of the spacers with respect to the previously performed etch process. Consequently, the trenches 134A, 134C may be provided with a step-like configuration, i.e., with a configuration in which the width may change in a step-like manner in a transition area 134S due to the different lateral target dimensions used for forming the trench portions 134U and 134L. In this respect, a step-like configuration is to be understood as a configuration in which a width of the lower portion 134L may change by approximately 5 percent of its bottom width within a height difference of less than approximately 20 nm. In other words, starting from the contact bar 122A, the lower portion 134L may have a specified bottom width, which may slightly vary with increasing height, wherein, however, a significant change may be provided in the transition area 134S within a height change of 20 nm and less so as to connect to the upper portion 134U. The upper portion 134U may have a top width that substantially corresponds to the target width 103T (FIG. 1b), which may be greater by at least 20 percent relative to the bottom width 104T (FIG. 1c).

It should be appreciated that, in other illustrative embodiments (not shown), a more or less pronounced degree of corner rounding may be established in the transition area 134S, depending on the process strategy for removing the spacer 104S (FIG. 1d).

Figure 1F:
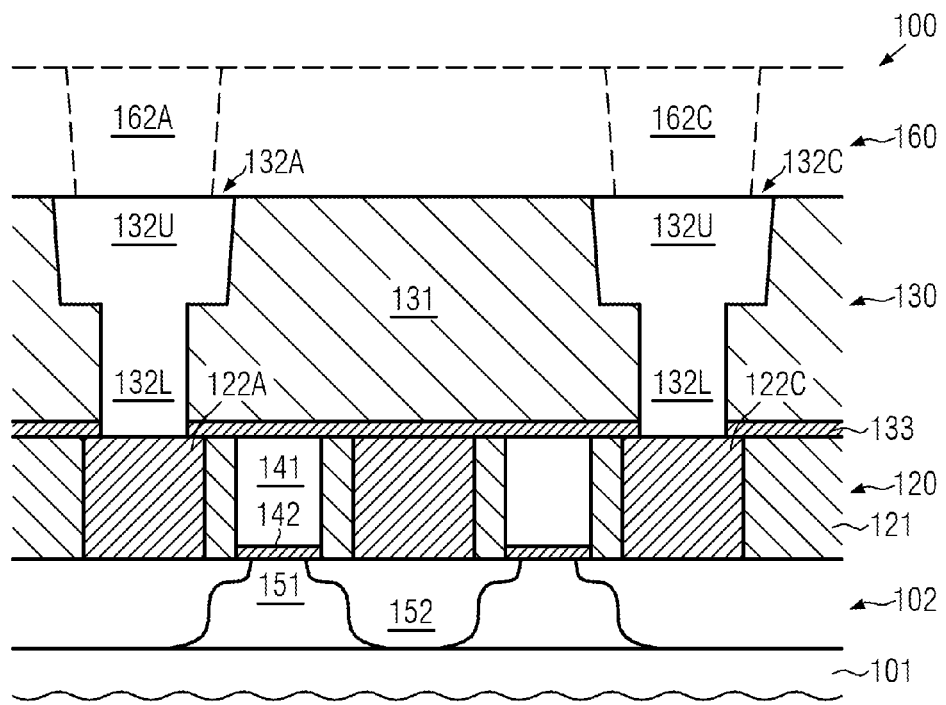

FIG. 1f schematically illustrates the device 100 in a further advanced manufacturing stage. As shown, metal lines 132A, 132C may be provided on the basis of the trenches 134A, 134C (FIG. 1e) so that the metal lines 132A, 132C may comprise an upper portion 132U and a lower portion 132L which may, in some illustrative embodiments, form a step-like configuration, as discussed above. The metal lines 132A, 132C may be formed by filling the trenches previously formed with any appropriate conductive material, such as a copper material, possibly in combination with an appropriate conductive barrier material, such as tantalum, tantalum nitride and the like. To this end, any well-established deposition techniques, such as sputter deposition, CVD, atomic layer deposition (ALD), electrochemical deposition techniques and the like, may be applied for forming any barrier materials and possibly any seed material, if required. Thereafter, typically, electrochemical deposition techniques may be applied, for instance, when depositing a copper material. Next, any excess material may be removed, for instance by CMP, wherein the etch mask 103 (FIG. 1e) may be also removed. Thereafter, the processing may be continued by forming a metallization layer 160, for instance on the basis of any appropriate dielectric material, and forming appropriate vertical contacts in the form of vias 162A, 162C therein. It should be appreciated that, due to the upper portions 132U having an increased top width, as discussed above, appropriate sized landing areas for the vias 162A, 162C may be provided.

Figure 1G:
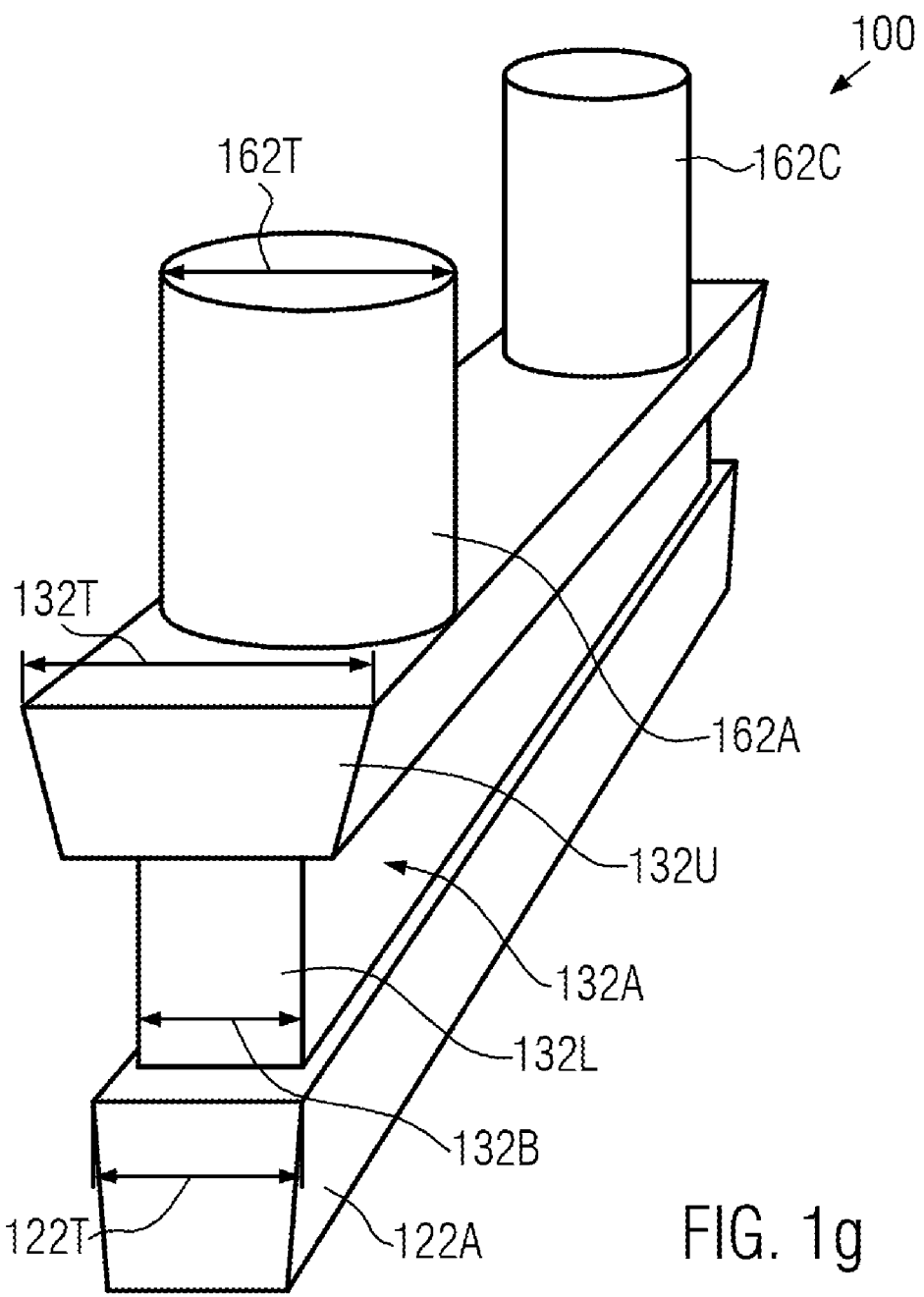
FIG. 1g schematically illustrates a perspective view of the resulting metal structure wherein vias of a metallization system may be efficiently connected to the metal line having the increased top width and the desired reduced bottom width, according to illustrative embodiments.

FIG. 1g schematically illustrates a perspective view of the resulting structure of the semiconductor device 100. For convenience, any dielectric materials are omitted in the representation of FIG. 1g. As shown, the metal line 132A is formed on the contact bar 122A and is appropriately aligned thereto, i.e., the lower portion 132L of the metal line 132A has a bottom width 132B that is less than a top width 122T of the contact bar 122A. On the other hand, the upper portion 132U has a top width 132T which is greater than a width 162T of the vias 162A, 162C. In this manner, low contact resistivity from the vias 162A, 162C to the metal line 132A may be achieved and also the probability of any misalignments may be reduced. On the other hand, the metal lines 132A may be appropriately aligned to the self-aligned contact bar 122A.

It should be appreciated that the metallization level 160 (FIG. 1f), which may represent part of a metallization system still to be formed, may be formed on the basis of well-established process techniques, for instance by depositing an appropriate dielectric material, which may be subsequently patterned on the basis of sophisticated lithography techniques. Thereafter, any appropriate metal, such as copper, possibly in combination with additional barrier materials, may be deposited and excess material may be removed by any removal process. It should be appreciated that also further metal lines may be formed commonly with the vias 162A, 162C, for instance by forming a further dielectric material above the level 160 and patterning the same so as to receive corresponding trenches, which may then be filled with a conductive material together with any via openings formed in the level 160.

With reference to FIGS. 2a-2e, further illustrative embodiments will now be described in more detail.

Figure 2A:
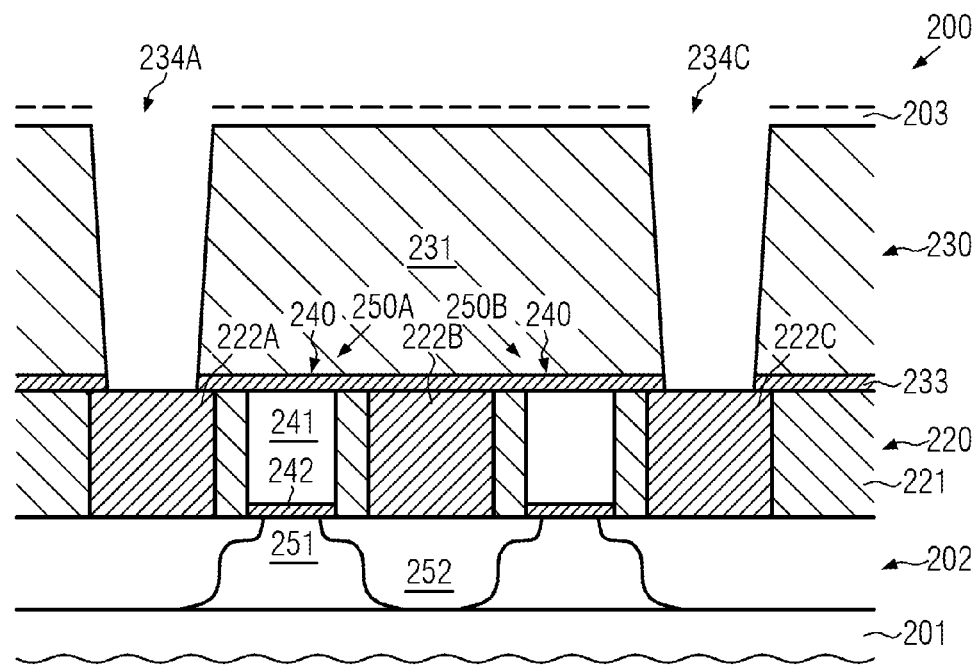
FIGS. 2a-2d schematically illustrate cross-sectional views of a semiconductor device during various manufacturing stages in forming a metal line of increased top width and reduced bottom width so as to connect to a contact bar, wherein a corresponding trench may be formed with a bottom width, followed by a further patterning of the upper trench portion, wherein, in some illustrative embodiments, locally restricted landing areas may be provided, according to further illustrative embodiments.

FIG. 2a schematically illustrates a semiconductor device 200 comprising a substrate 201 and a semiconductor layer 202, in and above which transistors 250A, 250B are provided, each comprising a gate electrode structure 240. Moreover, a contact level 220 is provided so as to comprise contact bars 222A, 222B, 222C. Furthermore, a further device level 230 is formed on the basis of a dielectric material 231 in combination with an etch stop layer 233. It should be appreciated that, for the components described so far, the same criteria may apply as previously discussed with reference to the semiconductor device 100. Thus, any detailed description of these components is omitted.

In the manufacturing stage shown, trenches 234A, 234C may be provided in the device level 230 and may connect to the contact bars 222A, 222C, respectively. The trenches 234A, 234C may have a bottom width which may correspond to a desired reduced bottom width so as to reliably connect to the contact bars 222A, 222C, as, for instance, also discussed above with reference to the target width 104T in FIG. 1c and the bottom width 132B of the metal line 132A, as shown in FIG. 1g. The semiconductor device 200 as shown in FIG. 2a may be formed on the basis of the following processes. The transistors 250A, 250B and the dielectric materials 231, 233 may be formed on the basis of manufacturing techniques as are also described above with reference to the semiconductor device 100. Thereafter, the dielectric material 231 may be patterned by using sophisticated lithography and etch techniques, for instance using a hard mask 203.

Figure 2B:
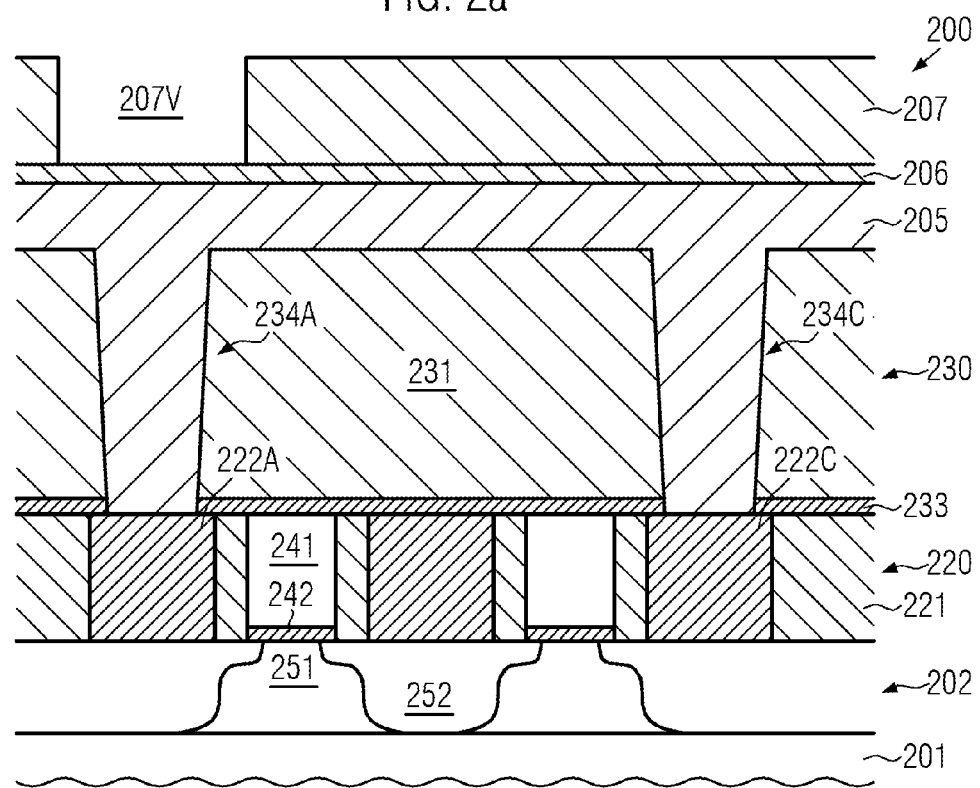

FIG. 2b schematically illustrates the semiconductor device 200 in a further advanced manufacturing stage. As shown, the trenches 234A, 234C are filled with an appropriate fill material 205, which may also form a substantially planar surface layer. For example, the material 205 may be provided as an optical planarization material, which may also act as an anti-reflective coating material. Furthermore, a further anti-reflective coating material 206 may be provided, for instance in the form of a silicon-containing organic material, followed by an appropriate resist mask 207. The resist mask 207 may comprise a mask opening 207V, which may thus define the lateral position and size of corresponding landing areas to be formed in at least some of the trenches 234A, 234C. In the embodiment shown, it may be assumed that the cross-sectional position corresponds to a position in which the trench 234A may require a landing area of increased width. The materials 205, 206 and 207 may be provided on the basis of well-established process techniques. Thereafter, the layers 206 and 205 may be patterned on the basis of the etch mask 207 and thereafter the further processing may be continued by etching into the dielectric material 231.

Figure 2C:
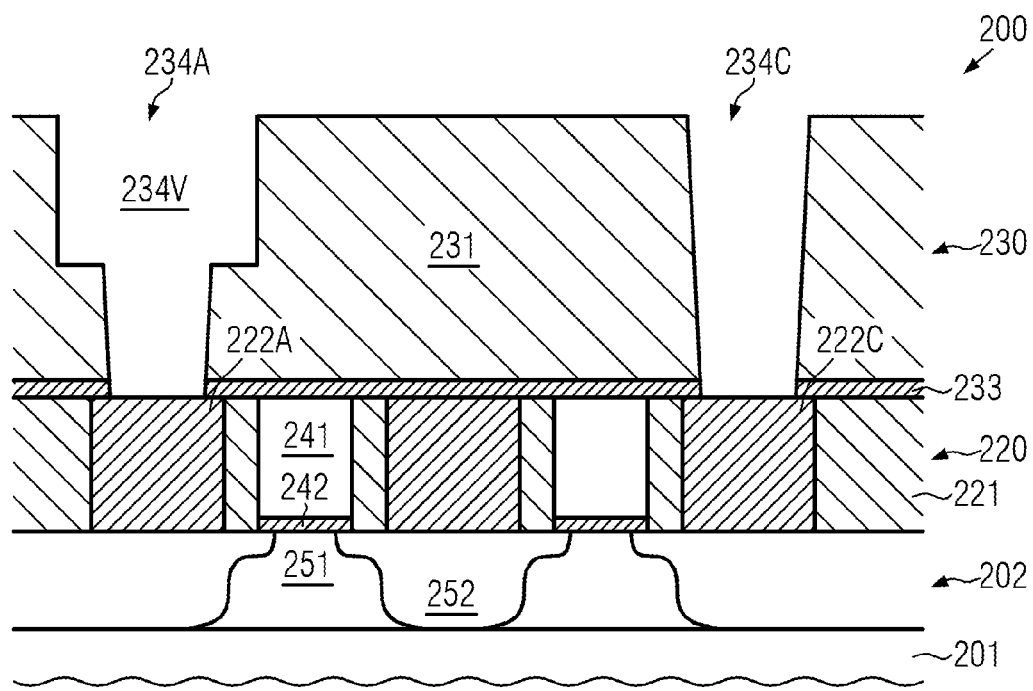

FIG. 2c schematically illustrates the device 200 in an advanced manufacturing stage. As shown, the trench 234A comprises an upper portion, indicated as 234V, which may represent a locally restricted area of increased lateral dimensions, while the trench 234C, at least at the position corresponding to the cross-section shown in FIG. 2c, may not require a corresponding landing area.

Figure 2D:
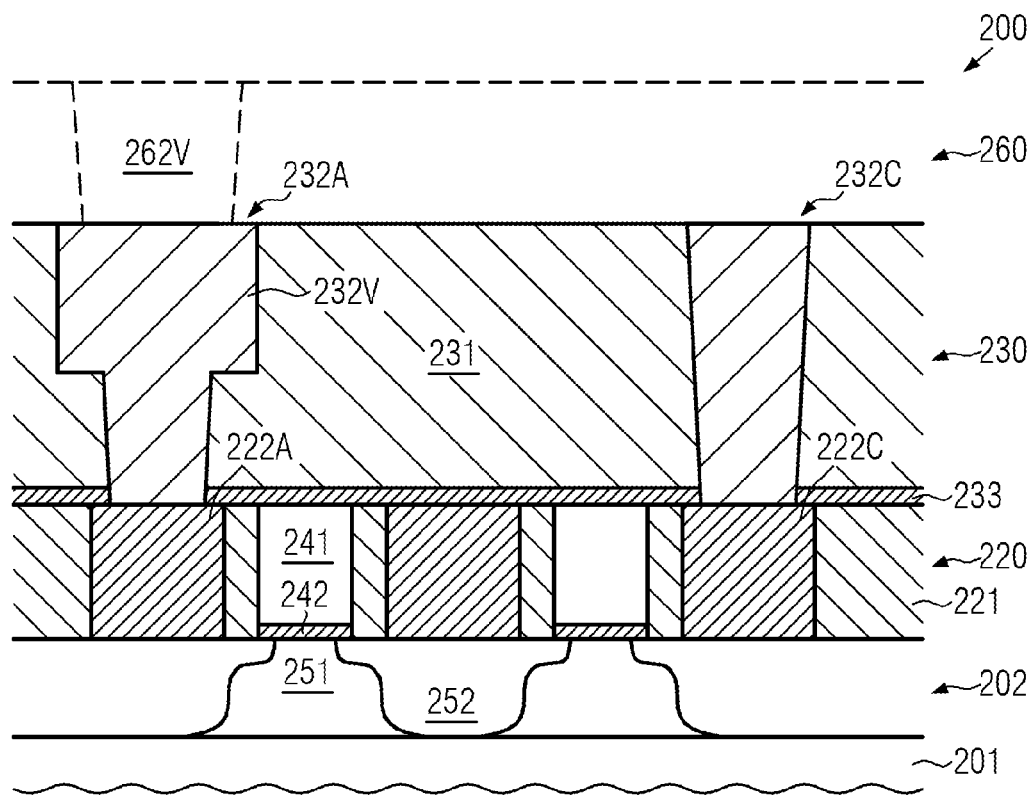

FIG. 2d schematically illustrates the device 200 in a further advanced manufacturing stage in which the trenches 234A, 234C of FIG. 2c have been filled with an appropriate conductive material, thereby forming metal lines 232A, 232C which thus connect to the contact bars 222A, 222C. To this end, any appropriate process techniques may be applied, as for instance discussed above. It should be appreciated that, if desired, the etch mask 203 (FIG. 2a) may be preserved throughout the entire process sequence and may be removed together with any excess material of the metal lines 232A, 232C. Thus, the metal line 232A comprises the upper portion 232V of increased lateral dimension so as to provide a top width as required for appropriately contacting the metal line 232A by means of a via 262V formed in a further device level 260, such as a part of a metallization system of the device 200.

Figure 2E:
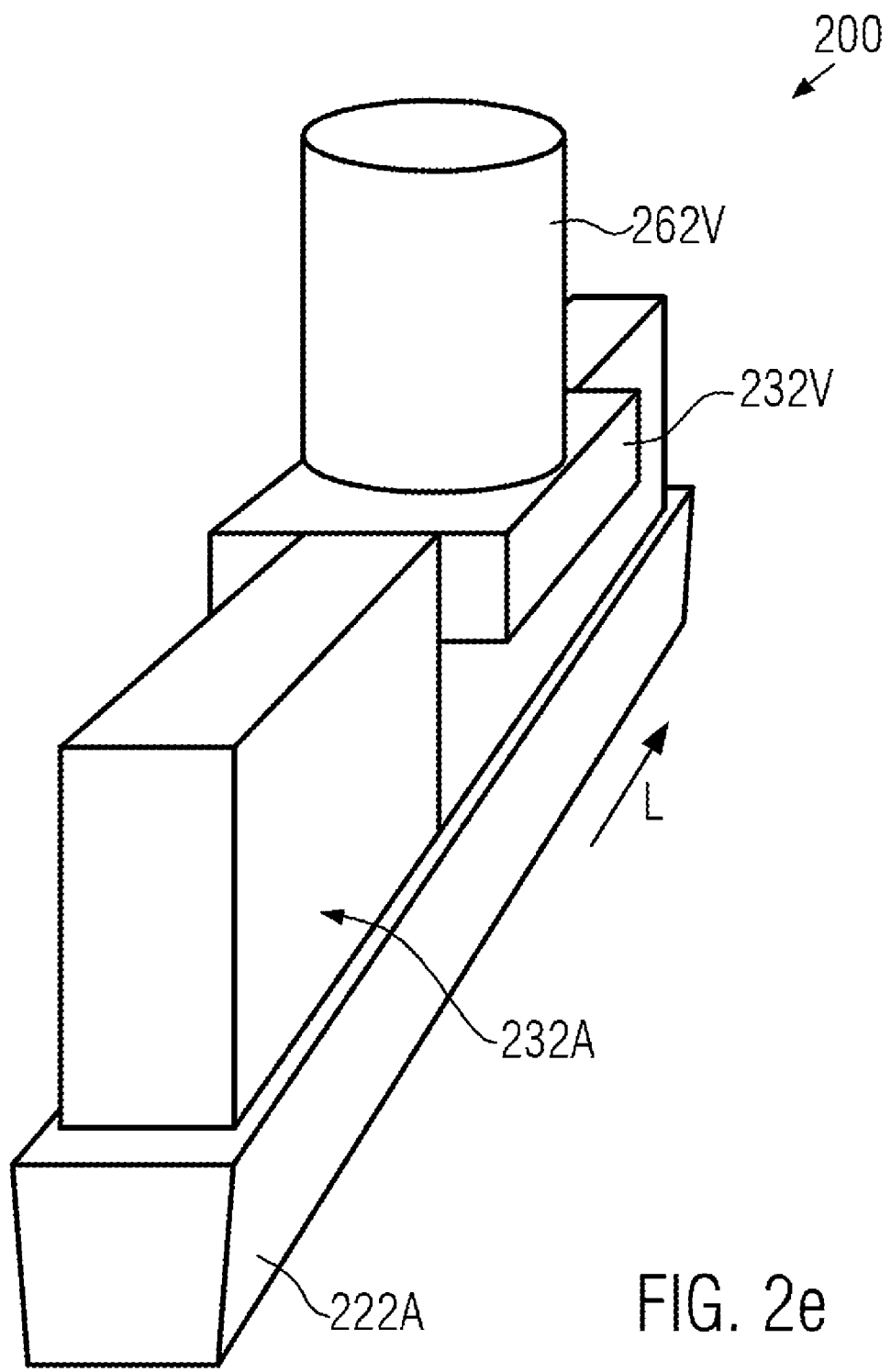
FIG. 2e schematically illustrates a perspective view of the semiconductor device having the locally restricted landing area, according to illustrative embodiments.

FIG. 2e schematically illustrates a perspective view of the semiconductor device 200 wherein, for convenience, only the contact bar 222A, the metal line 232A and the via 262V are illustrated. As shown, the metal line 232A comprises the upper portion 232V of increased lateral dimension, wherein the increased lateral dimensions are restricted along a length direction of the metal line 232A, as indicated by L, so as to reliably receive the via 262V. On the other hand, a reduced top width may be preserved throughout the remaining portion of the metal line 232A so that the corresponding portions 232V may be provided for any of the metal lines in compliance with the contact regime implemented by the vias 262V.

Figure 3A:
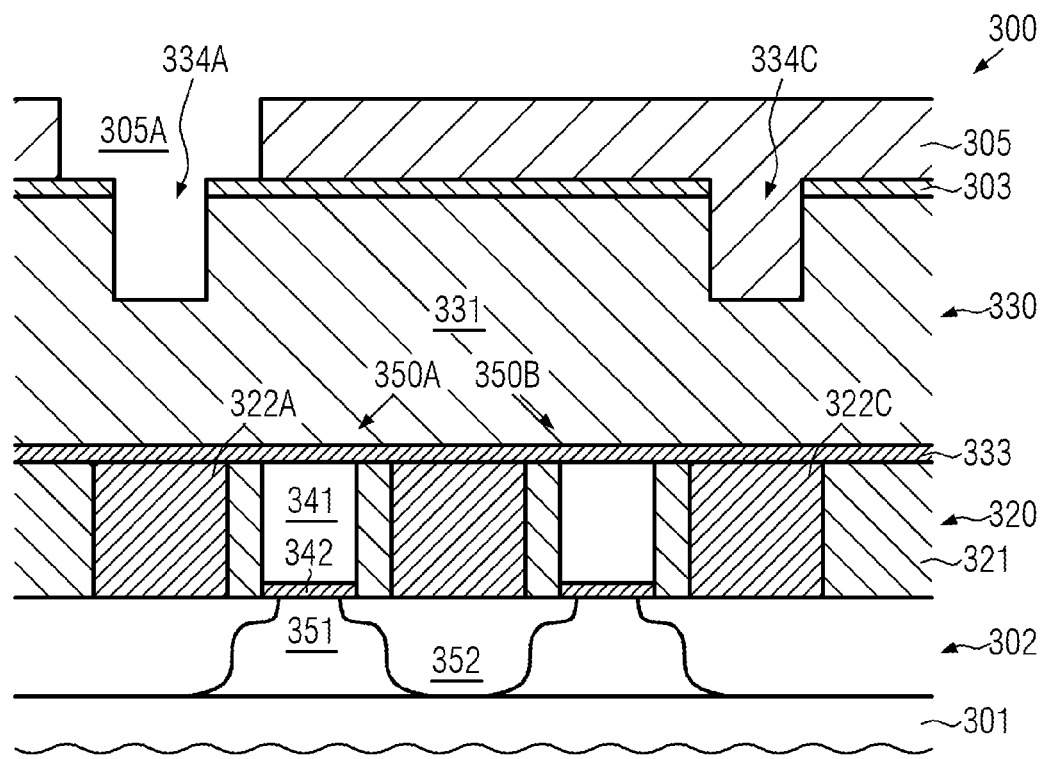
FIGS. 3a-3b schematically illustrate cross-sectional views of a semiconductor device during various manufacturing stages in forming a trench for connecting to contact bars, wherein, after a first etch process based on the bottom target dimension, the upper trench portion and the lower trench portion may be formed in a common etch process, according to further illustrative embodiments.
Figure 3B:
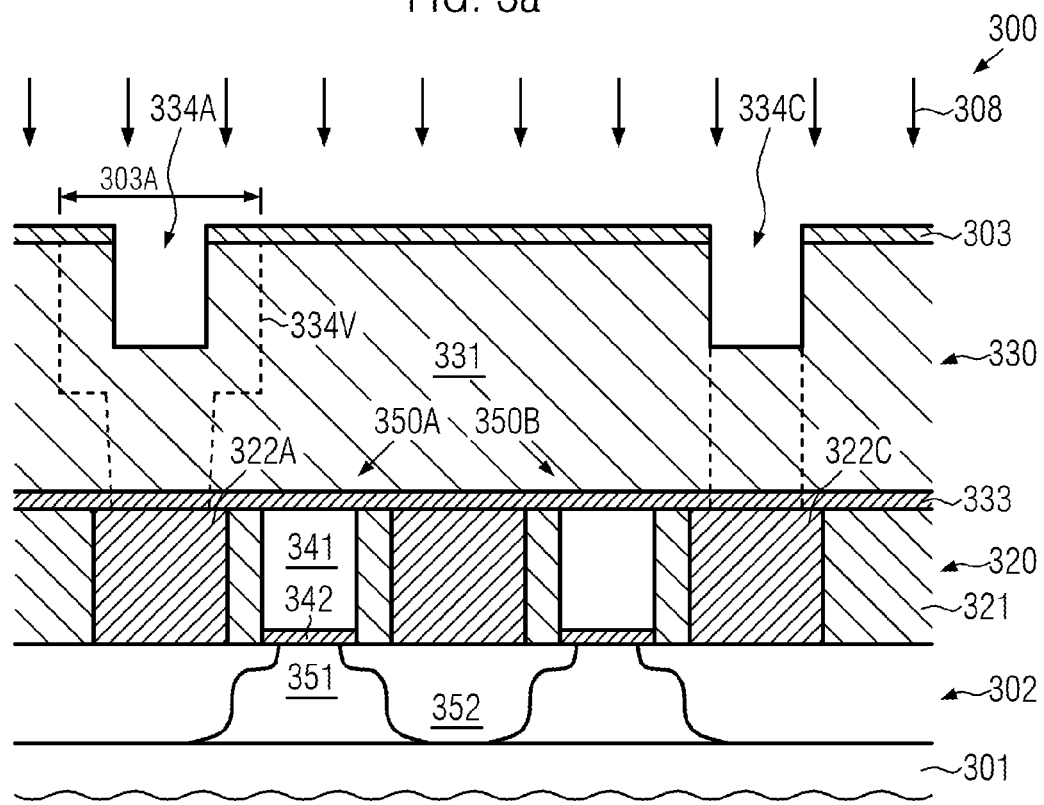

With reference to FIGS. 3a-3b, further illustrative embodiments will now be described.

FIG. 3a schematically illustrates a semiconductor device 300 comprising a substrate 301, a semiconductor layer 302, transistors 350A, 350B, contact bars 322A, 322C, a metal zero level 320 including a dielectric material 321 and an etch mask 303. With respect to these components, the same criteria may apply as previously explained with reference to the devices 100 and 200. Thus, a detailed description of these components is omitted. Moreover, these components may be formed on the basis of process strategies as previously described. Moreover, as shown, trenches 334A, 334C are provided in an upper part of the dielectric material 331 on the basis of target dimensions that may correspond to a bottom width of the trenches 334A, 334C in order to connect to the contact bars 322A, 322C. The trenches 334A, 334C may be obtained on the basis of a first etch process using the mask 303 and using similar process techniques, as discussed above. Thereafter, a further etch mask 305 may be provided on the basis of any appropriate process strategy, thereby "implementing" a desired bottom critical dimension for one or both of the trenches 334A, 334C, or at least for certain portions thereof, in which landing areas of increased lateral width are required. Consequently, the mask 305 may comprise an opening 305A, which may thus define the lateral size and position of any landing areas. To this end, any well-established lithography techniques may be applied, for instance using planarization materials, ARC materials and the like. Consequently, on the basis of the mask 305, the hard mask 303 may be appropriately modified in order to obtain the desired target width, the portions of increased lateral size in the trenches 334A, 334C, either in a locally restricted manner or to substantially completely extend along one or more of the trenches 334A, 334C.

FIG. 3b schematically illustrates the device 300 in a manufacturing stage in which the hard mask 303 comprises the modified opening 303A so as to define a desired increased top width of the trenches 334A, 334C in accordance with the overall process and device requirements. On the basis of the etch mask 303 having the opening 303A, a further etch process 308 may be applied in which the trenches 334A, 334C may be completed so as to connect to the underlying contact bars 322A, 322C, respectively, on the basis of the desired reduced lateral width. Concurrently, an upper portion 334V having the desired increased lateral width as defined by the opening 303A may be formed during the process 308. Consequently, during the process 308, the entire trench 334A may receive the increased upper portion or only specific positions may be provided, as is also discussed above with reference to the semiconductor device 200. Similarly, respective portions of increased lateral width may be formed in the trench 334C, if required, in order to comply with the contact regime so as to connect to a metallization system to be formed above the level 320. Thereafter, the further processing may be continued as is also described above.

As a result, the present disclosure provides semiconductor devices and manufacturing techniques in which superior uniformity and CD control are achieved upon forming metal lines that directly connect to self-aligned contact bars. In this manner, the metal lines may be provided with a bottom width that may be 20 nm and less, while a top width thereof may be significantly greater, for instance 30 nm or more, so as to enable a reliable contact to any vertical connections so as to establish the electrical connection to the remaining metallization system.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, the method comprising:
   providing a contact bar in a first dielectric material formed laterally between a first gate electrode structure and a second gate electrode structure, said contact bar having a width and a length;
   forming a second dielectric material above said first dielectric material and said contact bar;
   performing a first etch process on the basis of a first target critical dimension of a trench in said second dielectric material;
   performing at least one process so as to adjust a second target critical dimension of at least a portion of said trench, said second target critical dimension being greater than said first target critical dimension;
   performing a second etch process on the basis of said second target critical dimension so as to form said trench in said second dielectric material; and
   forming a metal material in said trench.

2. The method of claim 1, wherein performing said first etch process results in forming a lower trench portion and performing said second etch process results in forming an upper trench portion.

3. The method of claim 2, wherein said second etch process is performed so as to form said upper trench portion prior to performing said first etch process and wherein performing said at least one process comprises forming a spacer on inner sidewalls of said upper trench portion.

4. The method of claim 3, further comprising removing said spacer prior to forming said metal material in said trench.

5. The method of claim 1, wherein forming said metal material in said trench comprises forming a copper-containing material in said trench.

6. The method of claim 1, wherein performing said second etch process comprises selecting said second target critical dimension so as to be greater than a target bottom width of a via of a metallization layer to be formed above said metal-filled trench.

7. The method of claim 1, wherein said first etch process is performed prior to performing said second etch process.

8. The method of claim 7, wherein performing said second etch process comprises adjusting said second target critical dimension so as to define a top width of an upper trench portion at a locally restricted portion along the length of said trench.

9. The method of claim 7, wherein performing said first etch process comprises etching through said second dielectric layer.

10. The method of claim 9, wherein performing said second etch process comprises forming a sacrificial fill material in said trench and performing said second etch process in the presence of said sacrificial fill material.

11. The method of claim 7, wherein performing said first etch process comprises etching through an upper part of said second dielectric layer on the basis of a first etch mask.

12. The method of claim 11, wherein performing said second etch process comprises etching through said second dielectric layer so as to form a lower trench portion and an upper trench portion.

13. The method of claim 1, wherein providing said contact bar comprises forming said contact bar in a self-aligned process.

* * * * *